(12) United States Patent
Liao et al.

(10) Patent No.: US 11,917,830 B2
(45) Date of Patent: Feb. 27, 2024

(54) NAND FERROELECTRIC MEMORY CELL WITH THREE-DIMENSIONAL STRUCTURE AND PREPARATION METHOD THEREOF

(71) Applicant: XIANGTAN UNIVERSITY, Hunan (CN)

(72) Inventors: Min Liao, Hunan (CN); Siwei Dai, Hunan (CN); Yanwei Huan, Hunan (CN); Qijun Yang, Hunan (CN); Zhaotong Liu, Hunan (CN); Yichun Zhou, Hunan (CN)

(73) Assignee: XIANGTAN UNIVERSITY, Hunan (CN)

( * ) Notice: Subject to any disclaimer, the term of this patent is extended or adjusted under 35 U.S.C. 154(b) by 150 days.

(21) Appl. No.: 17/464,109

(22) Filed: Sep. 1, 2021

(65) Prior Publication Data
US 2022/0102379 A1    Mar. 31, 2022

(30) Foreign Application Priority Data
Sep. 25, 2020    (CN) .......................... 202011027562.7

(51) Int. Cl.
*H10B 51/20*    (2023.01)
*H10B 51/30*    (2023.01)
*H10B 51/50*    (2023.01)

(52) U.S. Cl.
CPC ............. *H10B 51/20* (2023.02); *H10B 51/30* (2023.02); *H10B 51/50* (2023.02)

(58) Field of Classification Search
CPC .......... H10B 51/20; H10B 51/30; H10B 51/50
See application file for complete search history.

(56) References Cited

U.S. PATENT DOCUMENTS

| | | | |
|---|---|---|---|
| 2021/0366932 A1* | 11/2021 | Lee ........................ | H10B 41/27 |
| 2021/0375931 A1* | 12/2021 | Lu .......................... | H01L 29/517 |
| 2022/0130862 A1* | 4/2022 | Lue ......................... | H10B 51/20 |
| 2022/0352197 A1* | 11/2022 | Matsuno ................. | H10B 43/10 |
| 2022/0406796 A1* | 12/2022 | Seki ........................ | H10B 43/20 |

* cited by examiner

*Primary Examiner* — David Vu
*Assistant Examiner* — Brandon C Fox
(74) *Attorney, Agent, or Firm* — CALDERON SAFRAN & COLE P.C.; Corinne Marie Pouliquen

(57) ABSTRACT

A NAND ferroelectric memory cell with a three-dimensional structure and a preparation method thereof are provided, the ferroelectric memory cell comprises: an oxide insulating layer, a channel layer, a channel buffer layer, a ferroelectric layer, and/or a gate buffer layer, and a gate arranged successively from the inside to the outside. In the memory cell of the present disclosure, the buffer layer has the following effects: 1. It can induce the crystallization of ferroelectric film to form ferroelectric phase; 2. It can reduce adverse effects caused by different crystalline characteristics of the channel layer and the ferroelectric layer, improve the quality and uniformity of the deposited film; 3. It can enhance the interface property of the channel layer, reduce leakage current, and enhance endurance of the device. Therefore, the buffer layer can improve the overall storage property and homogeneity of memory cells with a three-dimensional structure.

3 Claims, 5 Drawing Sheets

NAND FERROELECTRIC MEMORY CELL WITH THREE-DIMENSIONAL STRUCTURE AND PREPARATION METHOD THEREOF

CROSS REFERENCE TO RELATED APPLICATIONS AND CLAIM TO PRIORITY

This patent application claims the benefit and priority of Chinese Patent Application No. 202011027562.7, filed on Sep. 25, 2020, the disclosure of which is incorporated by reference herein in its entirety as part of the present application.

FIELD OF THE INVENTION

The present disclosure pertains to the field of semiconductor memory and integration, and particularly relates to a NAND ferroelectric memory cell with a three-dimensional structure and a preparation method thereof.

BACKGROUND OF THE INVENTION

A hafnium oxide-based ferroelectric field-effect transistor (FeFET) is a novel non-volatile memory that relies on two polarization states of hafnium oxide-based ferroelectric materials. Compared with other traditional ferroelectric materials, such as PZT, SBT, and the like, hafnium oxide materials have CMOS compatibility, high-K characteristics, and higher integration density. Since it was reported in 2011 that ferroelectricity was found in hafnium oxide-based materials, organizations in many countries have started to work on this. However, most of the prepared devices are mainly of a planar structure, and there are few reports on hafnium oxide based FeFET with a three-dimensional structure. Since the further reduction of device size causes integration problems and material reliability problems, three-dimensional integration has become an important way to improve the recording density of memory. Studies on current hafnium oxide based FeFET with a three-dimensional structure shows that for memory cells prepared in the same batch, their storage property is considerably different, which is specifically shown in the aspects: The threshold voltage distribution is uneven in the low threshold voltage state, and the fatigue and retention properties of the device vary greatly. Electrical characterization shows that the inhomogeneity of such memory cells may be attributed to combined effects of crystal growth kinetics, interface defect generation and distribution, and charge trapping difference during the uniform annealing and crystallization of ferroelectric layers and polysilicon channels. Another problem is that one of the main shortcomings of current devices is that their fatigue property is ≤$10^5$ cycles, which is generally believed to result from degradation of the interface layer between the channels and the interface of ferroelectric material under a cyclic electric field. When alternate write and erase pulses are applied to the gate, the inhomogeneity of such three-dimensional memory cells will become more obvious as the number of working cycles increases.

SUMMARY OF THE INVENTION

(1) Object of the Disclosure

It is an object of the present disclosure to provide a method for improving the storage property and homogeneity of a NAND ferroelectric memory cell in a three-dimensional structure, and to provide a preparation method.

(2) Technical Solution

In order to solve the above problems, the first aspect of the present disclosure provides a NAND ferroelectric memory cell with a three-dimensional structure comprising: an oxide insulating layer, a channel layer, a channel buffer layer, a ferroelectric layer, and a gate arranged successively from the inside to the outside; a channel buffer layer is arranged between the channel layer and the ferroelectric layer; and/or a gate buffer layer is arranged between the ferroelectric layer and the gate.

Further, a plurality of gates are arranged along the length direction of the gate buffer layer or the ferroelectric layer; an insulating layer is provided between adjacent gates.

Further, a protective layer is arranged on a side of a gate at one end in the length direction of the gate buffer layer that is away from the insulating layer.

Further, the protective layer is configured to have one or more layers.

Further, the channel buffer layer and the gate buffer layer (6) are made of a high-K material or other insulating oxide materials; preferably, the insulating oxide material is a high-K material.

Further, the channel buffer layer and the gate buffer layer are a single-layer structure or a double-layer structure; the single-layer structure is made of an amorphous material or a polycrystalline material; the double-layer structure consists of a layer made of an amorphous material and a layer made of a polycrystalline material, or of two layers made of different polycrystalline materials.

Further, the ferroelectric layer is made of a ferroelectric material; the ferroelectric material includes an $Hf_{0.5}Zr_{0.5}O_2$ material or a doped hafnium oxide material; the doping element includes Zr, Y, Al, Gd and Si.

The second aspect of the present disclosure provides a method for preparing a NAND ferroelectric memory cell, comprising: alternately depositing a plurality of insulating layers and gates on a substrate; depositing a silicon oxide protective layer and an aluminum oxide protective layer on the plurality of alternately deposited insulating layers and gates to complete a stacked gate; etching a through hole of a predetermined size on the stacked gate directly to the substrate; and successively depositing, on the inner wall of the through hole, a gate buffer layer, a ferroelectric layer, a channel buffer layer, a channel layer, and an oxide insulating layer; or a gate buffer layer, a ferroelectric layer, a channel layer, and an oxide insulating layer; or a ferroelectric layer, a channel buffer layer, a channel layer, and an oxide insulating layer.

Further, the preparation method further comprises: depositing a source on one end of the through hole away from the substrate.

Further, an etching protection layer is deposited after depositing the gate buffer layer, the ferroelectric layer, and the channel buffer layer.

(3) Beneficial Effects

The above technical solution of the present disclosure has the following beneficial technical effects:

In the memory cell of the present disclosure, a channel buffer layer, or a gate buffer layer or both are arranged on one or both sides of the ferroelectric layer. In one aspect, it can induce the crystallization of a ferroelectric film to form ferroelectric phase. In a second aspect, it can reduce adverse effects caused by different crystalline characteristics of the channel layer and the ferroelectric layer during uniform annealing crystallization and improve the quality and uniformity of the deposited film. In a third aspect, it can enhance the interface property of the channel layer, reduce leakage current, and enhance endurance of the device. Therefore, the buffer layers can improve the overall storage property and homogeneity of a memory cell with a three-dimensional structure, specifically enlarging the memory window of a memory cell, enhancing its fatigue property, and improving the homogeneity of storage property of multiple transistors.

REFERENCE NUMERALS

1: Substrate; 2: insulating layer; 3: gate; 4: silicon oxide protective layer; 5: aluminum oxide protective layer; 6: gate buffer layer; 7: etching protective layer; 8: ferroelectric layer; 9: channel buffer layer; 10: channel; 11: oxide insulating layer; 12: drain; 13: metal wire.

DETAILED DESCRIPTION OF THE PREFERRED EMBODIMENT(S)

To make the purposes, technical solutions and advantages of the present disclosure clearer, the present disclosure is further described hereinbelow in detail in conjunction with specific embodiments and with reference to the drawings. It should be understood that these descriptions are only exemplary and are not intended to limit the scope of the present disclosure. In addition, descriptions of well-known structures and technologies are omitted to avoid unnecessarily obscuring the concept of the present disclosure.

The drawings show schematic diagrams of a layer structure according to an example of the present disclosure. These diagrams are not drawn to scale, in which some details are exaggerated for clarity purposes, and some details may be omitted. The shapes of the various regions and layers shown in the figures, as well as the relative size and positional relationship between them are only exemplary. In practice, there may be deviations due to manufacturing tolerances or technical limitations. Besides, a person skilled in art can design areas/layers with different shapes, sizes, and relative positions if desired.

Obviously, the described examples are part of the examples of the present disclosure, rather than all the examples. Based on the examples of the present disclosure, all other examples obtained by a person of ordinary skill in the art without doing inventive work shall fall within the protection scope of the present disclosure.

Example 1

Figure 1:
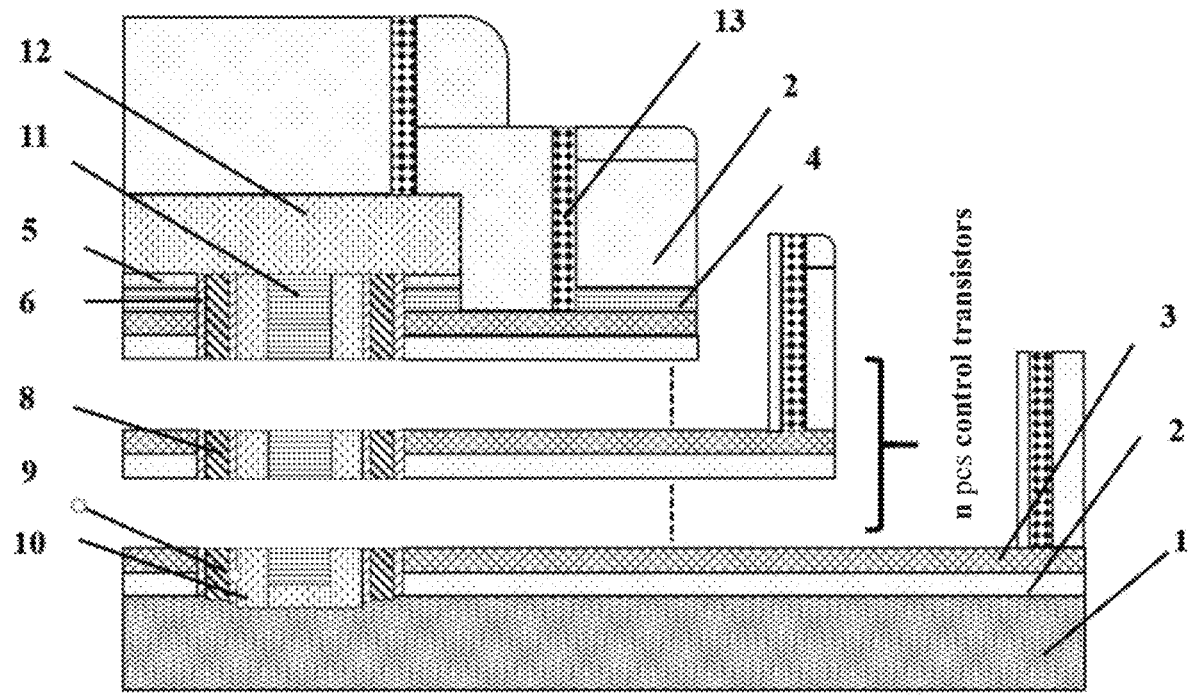
FIG. 1 is a schematic diagram of the cross-sectional structure of a NAND ferroelectric memory cell with a three-dimensional structure provided by Example 1 of the present disclosure.

FIG. 1 is a schematic diagram of the cross-sectional structure of a NAND ferroelectric memory cell with a three-dimensional structure provided by Example 1 of the present disclosure.

As shown in FIG. 1, this example provides a NAND ferroelectric memory cell, comprising: an oxide insulating layer, a channel layer, a channel buffer layer, a ferroelectric layer, and a gate arranged successively from the inside to the outside; a channel buffer layer is arranged between the channel layer and the ferroelectric layer; and/or a gate buffer layer is arranged between the ferroelectric layer and the gate. Specifically, it comprises an oxide insulating layer, a channel layer, a channel buffer layer, a ferroelectric layer, and a gate buffer layer; or an oxide insulating layer, a channel layer, a ferroelectric layer, and a gate buffer layer; or an oxide insulating layer, a channel layer, a channel buffer layer, and a ferroelectric layer.

The memory cell of this example is configured to have a channel buffer layer or a gate buffer layer or both. In one aspect, it can induce the crystallization of ferroelectric film to form ferroelectric phase. In a second aspect, it can reduce adverse effects caused by different crystalline characteristics of the channel layer and the ferroelectric layer during uniform annealing crystallization, and improve the quality and uniformity of the deposited film. In a third aspect, the buffer layer can enhance the interface property of the channel layer, reduce leakage current, and enhance endurance of the device. Therefore, the buffer layers can improve the overall storage property and homogeneity of a memory cell with a three-dimensional structure, specifically enlarging the memory window of a memory cell, enhancing its fatigue property, and improving the homogeneity of storage property of multiple transistors.

Specifically, the source can be selected from an n-type Si substrate; the drain, which can be selected from a highly doped n-type polysilicon, is connected to a cylindrical annular structure and the other side of an insulating layer.

Optionally, a plurality of the gates are arranged along the length direction of the gate buffer layer; an insulating layer is arranged between adjacent gates. The gates and insulating layers, the number of which is n+2, together with a cylindrical annular structure, form a TOP selection transistor, intermediate control transistors, the number of which is n, and a Bottom selection transistor. Each gate is connected to a metal wire. The gate may be a doped polysilicon gate of 50 nm to 1 μm, and the insulating layer may be a $SiO_2$ insulating layer of 30 nm. Among them, the intermediate control transistors, the number of which is n, are used to store information.

Optionally, a protective layer is arranged on a side of the gate at one end in the length direction of the gate buffer layer that is away from the insulating layer. The protective layer acts as an insulating and barrier layer, reducing the diffusion of source doping elements to the stacked gate. Optionally, the protective layer may be configured to have two layers, including a silicon oxide protective layer and an aluminum oxide protective layer. Specifically, the silicon oxide protective layer is 20 nm, and the aluminum oxide protective layer is also 20 nm.

Optionally, the channel buffer layer and the gate buffer layer are made of insulating oxide materials, preferably high-K materials.

Further optionally, the channel buffer layer and the gate buffer layer are a single-layer structure or a double-layer structure; the single-layer structure is made of an amorphous material or a polycrystalline material; the double-layer structure consists of a layer made of an amorphous material and a layer made of a polycrystalline material, or of two layers made of different polycrystalline materials. Among these, the buffer layer material is $Al_2O_3$, $ZrO_2$, $HfO_2$, $La_2O_3$, $Y_2O_3$, or $HfO_2$ doped with a single element of N, Si, Al, Ti, Ta and La or doped with two or more thereof, or other oxide insulating layers, having a thickness of 0.5 to 3 nm, preferably 2 nm. If the buffer layer is a crystalline layer, the film will be too thin to be sufficiently crystallized and exert its effect. Moreover, no matter whether the film is crystalline or amorphous, if the film is too thin, it will be easily affected by element diffusion and cannot sufficiently exert its effect. If the film is too thick, there will be a depolarization field formed inside the film, which reduces the memory window. A medium thickness of 2 nm can make the film sufficiently exert its effect.

Optionally, the ferroelectric layer is made of a ferroelectric material; the ferroelectric material includes an $Hf_{0.5}Zr_{0.5}O_2$ material or a doped hafnium oxide material; the doping element includes Zr, Y, Al, Gd and Si, etc.; the thickness of the ferroelectric layer is 3 to 30 nm, preferably 10 nm; the ferroelectricity of the film is affected by surface energy, and a thickness of 10 nm is conducive to the ferroelectricity of the film.

In this example, silicon-based materials are used for the drain, source, gate, and channel to improve the thermal budget generated by multiple annealing and eliminate stress. The thermal budget refers to the internal stress caused by the difference in thermal expansion coefficient during cooling.

It should be noted that the NAND ferroelectric memory cell with a vertical structure as proposed by the example of the present disclosure is a non-volatile ferroelectric memory cell based on a Flash three-dimensional memory structure and CMOS compatibility characteristics of hafnium oxide-based ferroelectric materials. And only one ferroelectric memory series is used as an example for illustrative purposes, other memory cells in the three-dimensional structure can be obtained by translation in space. The metal connection of the cell is similar to that of the Flash three-dimensional memory structure.

Example 2

Figure 2:
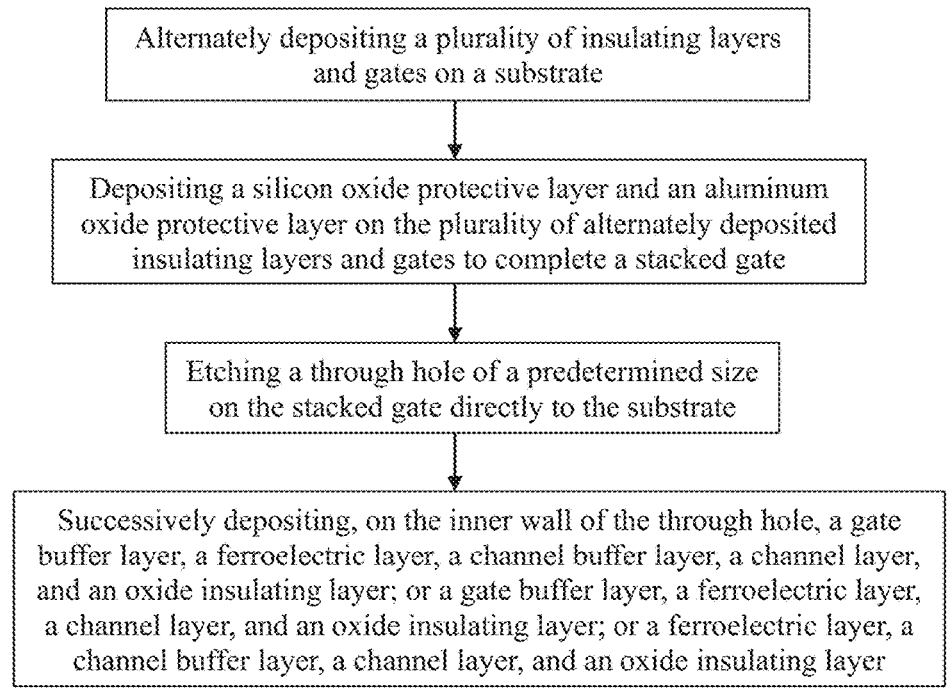
FIG. 2 is a flowchart of the method for preparing a NAND ferroelectric memory cell with a three-dimensional structure provided by Example 2 of the present disclosure.

FIG. 2 is a flowchart of the method for preparing a NAND ferroelectric memory cell with a three-dimensional structure provided by Example 2 of the present disclosure.

As shown in FIG. 2, this example provides a method for preparing a NAND ferroelectric memory cell, comprising: alternately depositing a plurality of insulating layers and gates on a substrate; depositing a silicon oxide protective layer and an aluminum oxide protective layer on the plurality of alternately deposited insulating layers and gates to complete a stacked gate; etching a through hole of a predetermined size on the stacked gate directly to the substrate; and successively depositing, on the inner wall of the through hole, a gate buffer layer, a ferroelectric layer, a channel buffer layer, a channel layer, and an oxide insulating layer; or a gate buffer layer, a ferroelectric layer, a channel layer, and an oxide insulating layer; or a ferroelectric layer, a channel buffer layer, a channel layer, and an oxide insulating layer.

Optionally, the preparation method further comprises: depositing a source on an end of the through hole away from the substrate.

Optionally, a very thin Si layer is deposited as an etching protection layer after depositing the gate buffer layer, the ferroelectric layer and the channel buffer layer; a clean-up treatment is performed after depositing a film at the bottom of the etching trench; and a further deposition is then carried out.

The method for preparing a NAND ferroelectric memory cell provided in this example is described in detail with reference to the drawings.

FIGS. 3 to 11 are schematic diagrams of the fabrication of a NAND ferroelectric memory cell provided by Example 2 of the present disclosure.

As shown in FIGS. 3 to 11, it mainly includes the following steps:

Step 1: A horizontal silicon substrate is washed to remove surface oxides. A drain is formed by ion implantation; the energy of implanted ions is 30 eV, and the dose is $2\times10^{15}$ $cm^{-2}$ $P^+$. Then, annealing at 1050° C. for dopant activation.

Figure 3:
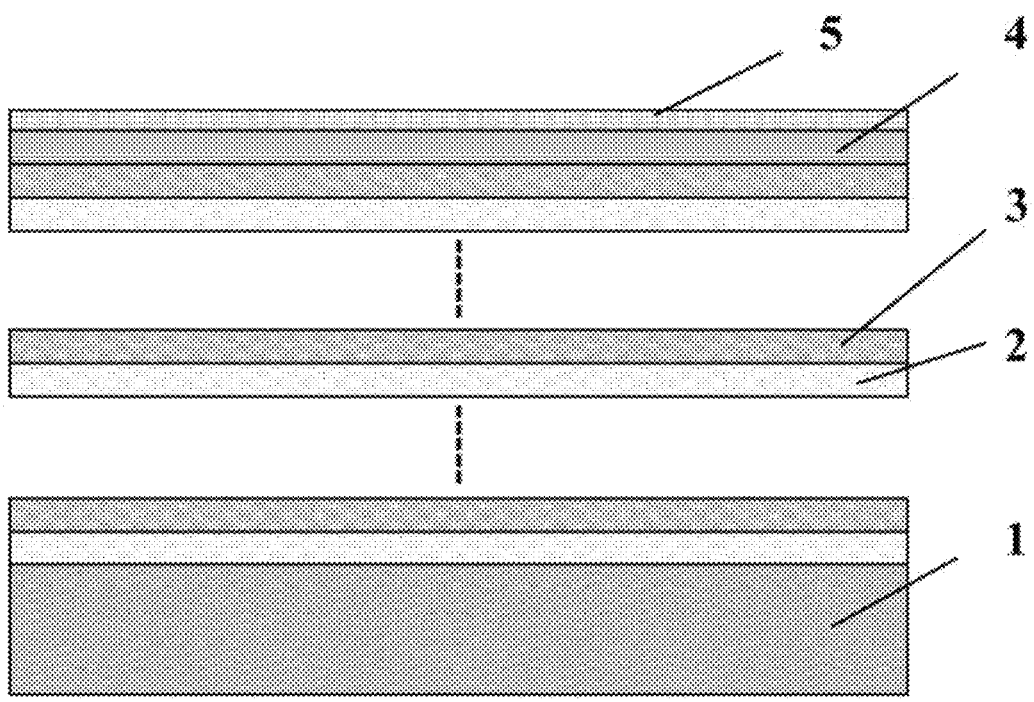
FIGS. 3 to 11 are schematic diagrams of the fabrication of a NAND ferroelectric memory cell with a three-dimensional structure provided by Example 2 of the present disclosure.

Step 2: Numerous groups of silicon oxide layers of 30 nm and doped polysilicon gate layers of 50 nm to 1 μm are deposited successively, and then a silicon oxide insulating layer of 20 nm and an aluminum oxide insulating layer of 20 nm are deposited. And then, annealing at 1000° C. for dopant activation as shown in FIG. 3.

It should be noted that the protective layer silicon oxide and aluminum oxide are deposited by CVD, ALD or other film deposition methods; the polysilicon gate is deposited using a low-pressure CVD process, and impurity gases are introduced during the deposition reaction for in-situ doping.

Figure 4:
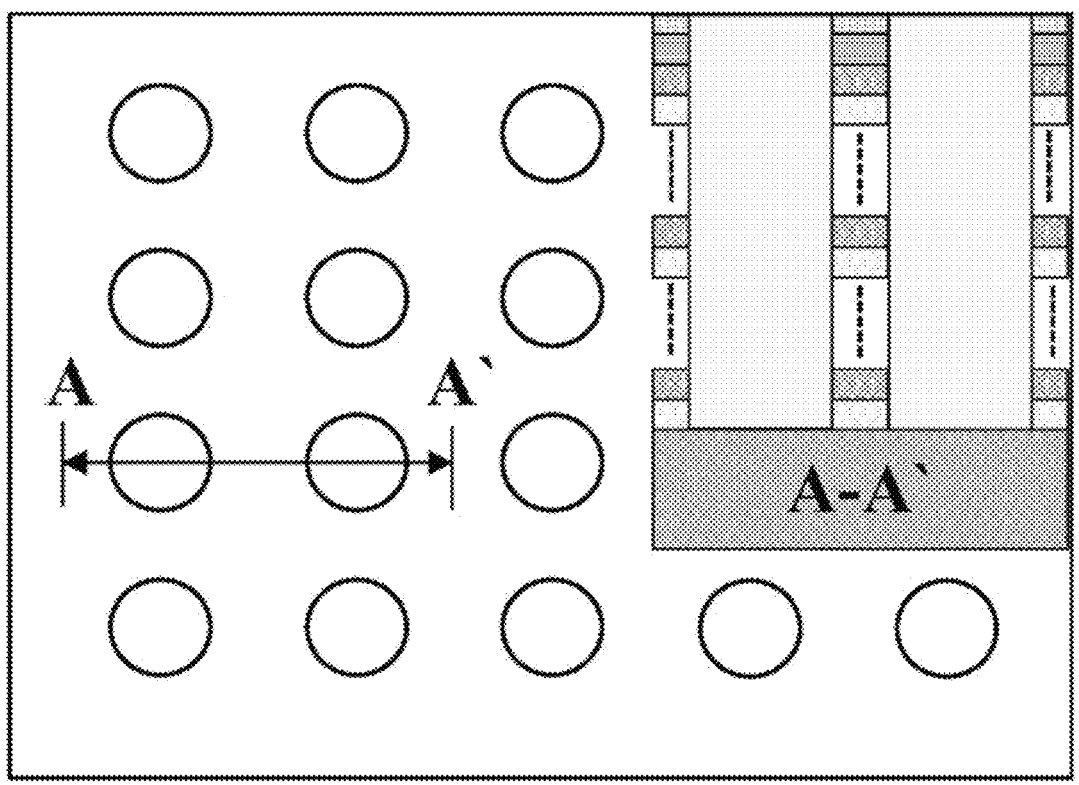
Figure 5:
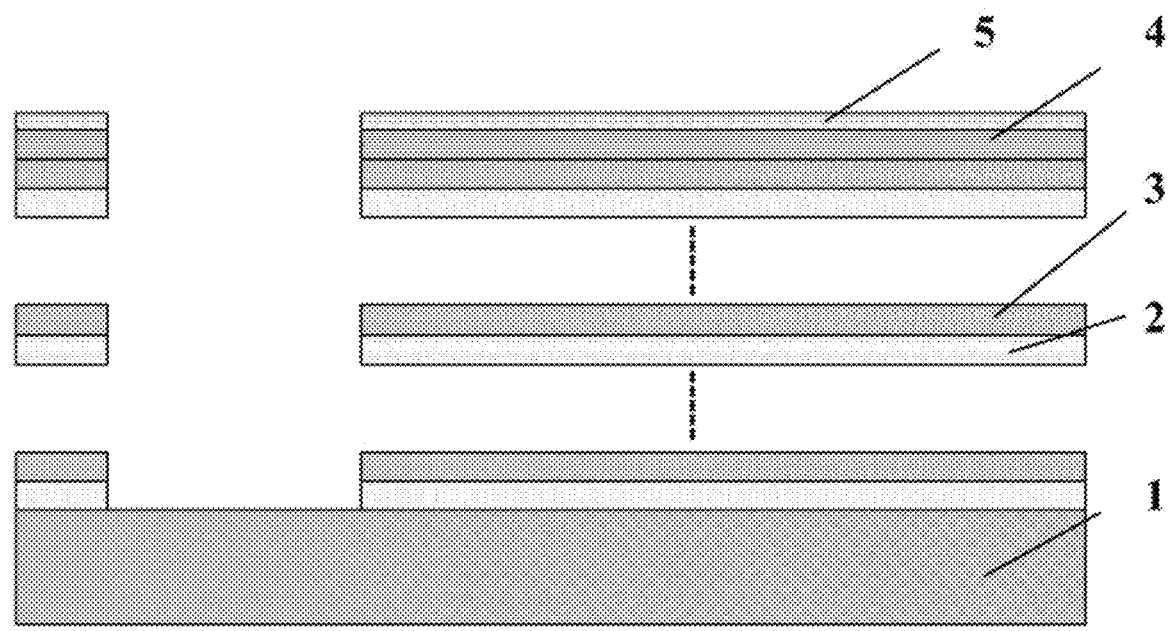

Step 3: A window of a vertical annular trench is etched by a photolithography process, and then a vertical annular trench is etched by a dry etching process on the multilayer film deposited in step 2 to form a columnar annular through hole as a filling zone; the bottom of the trench extends to the silicon substrate. A top view of the cylindrical annular zone is shown in FIG. 4, and a cross-sectional view of a single cylindrical annular zone is shown in FIG. 5.

Figure 6:
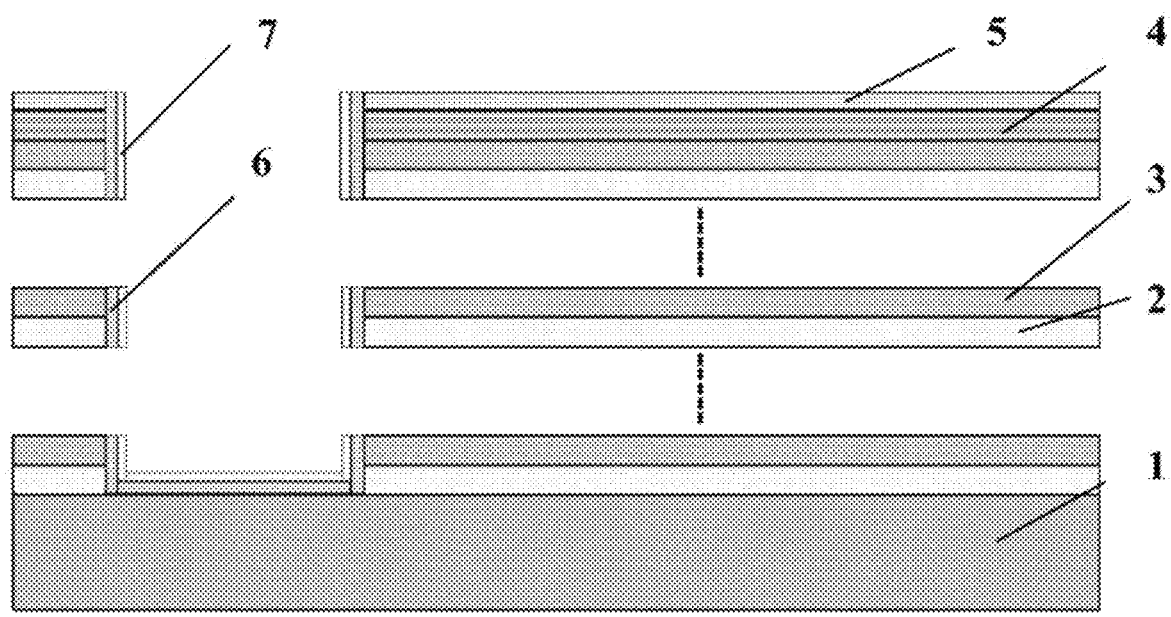

Step 4: A first gate buffer layer of 0.5 to 3 nm is deposited by ALD method, and after the completion of deposition, an etching protection layer (Si) of 1 nm is then deposited thereon; the effect diagram after the completion of step 4 is shown in FIG. 6.

It should be noted that the buffer layer material, such as $Al_2O_3$, $ZrO_2$, $HfO_2$, $La_2O_3$, $Y_2O_3$, or $HfO_2$ doped with a single element of N, Si, Al, Ti, Ta and La or doped with two or more thereof, or other oxide insulating layers, etc. has a thickness of about 0.5 to 3 nm;

It should be noted that due to the good conformality of the ALD method, the bottom of the trench will also be covered with a layer of the deposited film. Therefore, every time after the deposition of a new layer, there is a need to further deposit an etching protection layer (thin Si layer), and then remove it later.

Figure 7:
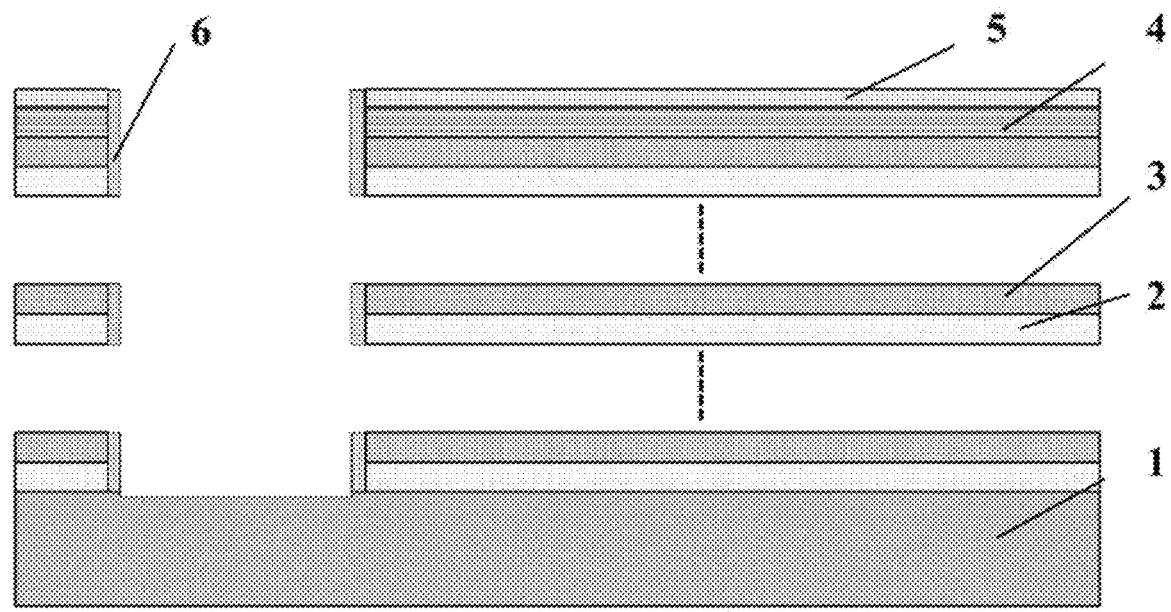
Figure 8:
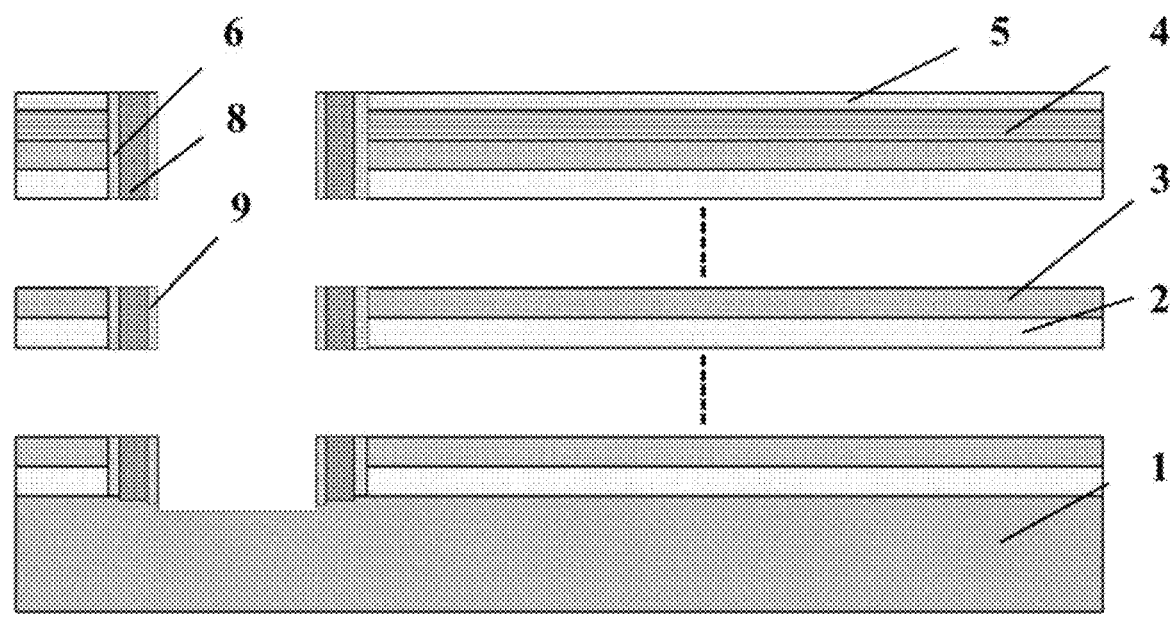

Step 5: The film deposited at the bottom of the trench by a photolithography process and a dry etching process is removed to ensure that the trench can be sufficiently contacted with the silicon substrate, as shown in FIG. 7. After the completion of etching, the remaining thin silicon layer is removed by using HF, which at the same time will also etch away a part of the silicon substrate and leave a small staircase; the effect diagram is shown in FIG. 8.

Step 6: A hafnium oxide-based ferroelectric layer is deposited by ALD method.

It should be noted that the ferroelectric material is $Hf_{0.5}Zr_{0.5}O_2$ (HZO) material or other doped hafnium oxide materials with a thickness of about 3 to 30 nm.

Figure 9:
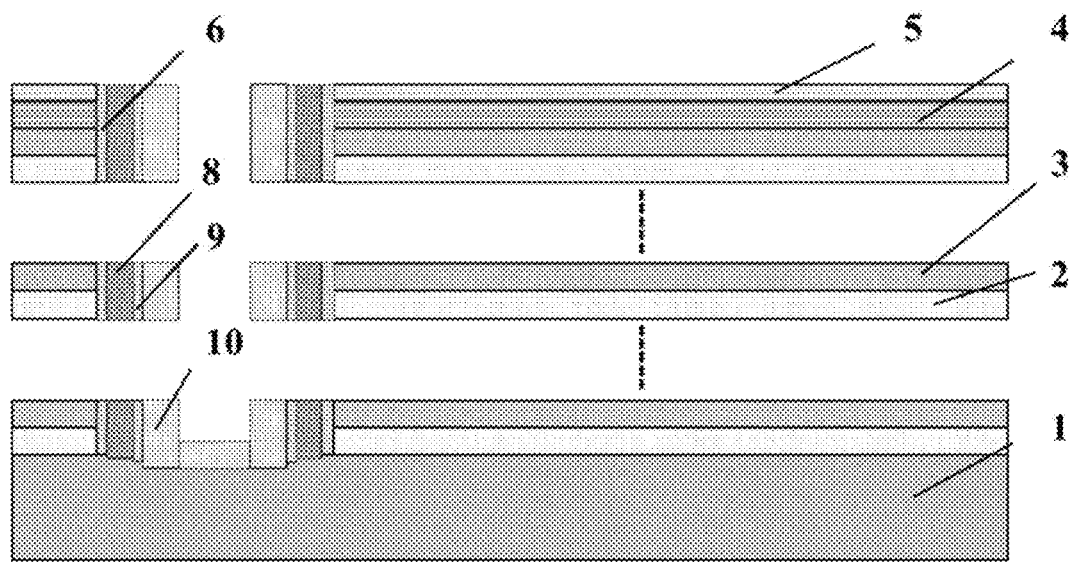

Step 7: A channel buffer layer and an etching protection layer are deposited sequentially by ALD method, and the removal thereof is as shown in Step 5; a cross-sectional view after the composition of film deposition in Steps 4 to 7 is shown in FIG. 9.

Figure 10:
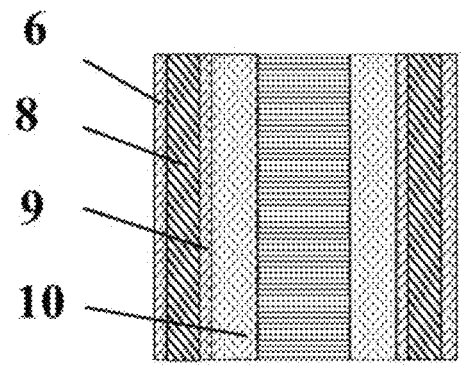

Step 8: A doped polysilicon channel layer is deposited by ALD method; the doping element is a donor doping element such as P to form an n-type channel. A cross-sectional view after the completion of Step 8 of film deposition is shown in FIG. 10.

Step 9: In order to crystallize the ferroelectric layer and the polysilicon channel, uniform crystallization annealing is performed in a mixed atmosphere of nitrogen and oxygen at a temperature of 850° C. for 30 minutes.

Figure 11:
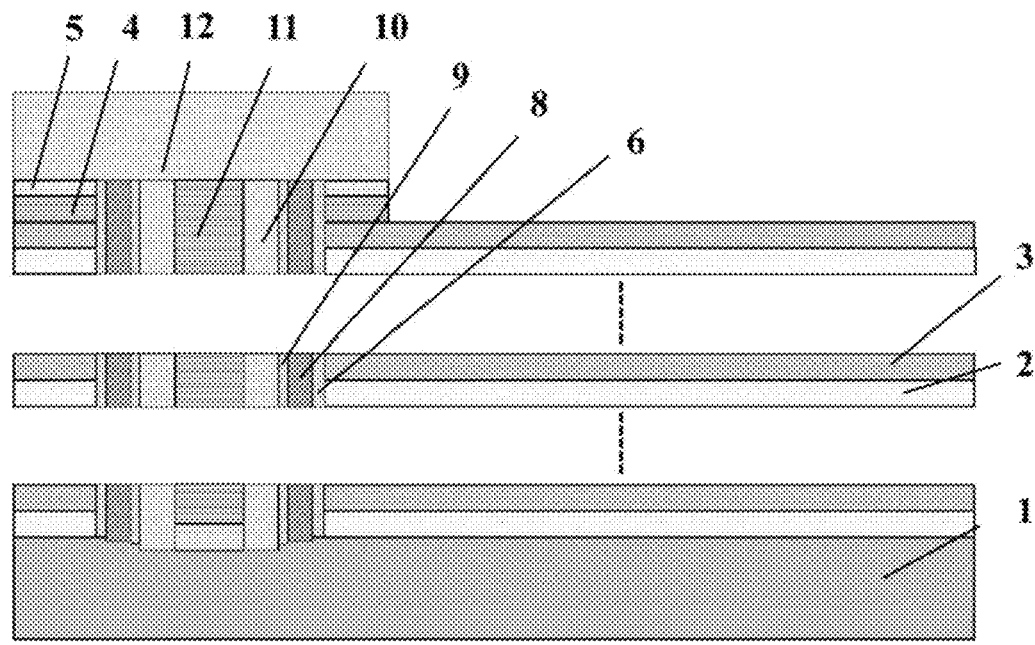

Step 10: An insulating layer oxide is deposited by ALD method, and the insulating layer oxide is selected from silicon oxide or the like. The structure of the cylindrical annular zone is shown in FIG. 11.

Step 11: A highly doped polysilicon drain is deposited by CVD, ALD or other film deposition methods, and annealing is performed after the completion of deposition. A cross-sectional view after the completion of deposition in Step 10 is shown in FIG. 11.

Step 12: Metallization connection. An effect diagram is shown in FIG. 1.

It should be noted that the memory cell proposed in the present disclosure is a ferroelectric memory cell based on a Flash three-dimensional memory architecture, and its metallization connection is similar to that of the Flash three-dimensional memory architecture, and will not be described in detail herein.

It should be understood that the above specific embodiments of the present disclosure are only used for exemplary purposes or to explain the principle of the present disclosure, and are not intended to limit the present disclosure. Therefore, any modifications, equivalent replacements, improvements, and the like, made without departing from the spirit and scope of the present disclosure should be included in the protection scope of the present disclosure. In addition, the appended claims of the present disclosure are intended to cover all variations and modifications that fall within the scope and boundary of the appended claims, or within equivalent forms of such scope and boundary.

What is claimed is:

1. A method for preparing a NAND ferroelectric memory cell with a three-dimensional structure, comprising:
    alternately depositing a plurality of insulating layers (2) and gates (3) on a substrate (1);
    depositing a protective layer on the alternately deposited insulating layers (2) and gates (3) to complete a stacked gate;
    etching a through hole of a predetermined size on the stacked gate directly to the substrate (1);
    successively depositing, on the inner wall of the through hole, a gate buffer layer (6), a ferroelectric layer (8), a channel buffer layer (9), a channel layer (10), and an oxide insulating layer (11); or a gate buffer layer (6), a ferroelectric layer (8), a channel layer (10), and an oxide insulating layer (11); or a ferroelectric layer (8), a channel buffer layer (9), a channel layer (10), and an oxide insulating layer (11), wherein an etching protection layer (7) is respectively deposited after depositing the gate buffer layer (6), the ferroelectric layer (8) and the channel buffer layer (9).

2. The preparation method according to claim 1, further comprising, after completion of deposition of oxide insulating layer (11),
    annealing crystallization, which is a uniform annealing crystallization performed in a mixed atmosphere of nitrogen and oxygen; an annealing temperature is 850° C., and annealing time is 30 minutes.

3. The preparation method according to claim 1, further comprising depositing a source on one end of the through hole away from the substrate (1).

* * * * *